United States Patent [19]

Ashar et al.

[11] Patent Number: 6,038,392

[45] Date of Patent: Mar. 14, 2000

[54] IMPLEMENTATION OF BOOLEAN SATISFIABILITY WITH NON-CHRONOLOGICAL BACKTRACKING IN RECONFIGURABLE HARDWARE

[75] Inventors: Pranav Ashar; Sharad Malik; Margaret Martonosi; Peixin Zhong, all of Princeton, N.J.

[73] Assignee: NEC USA, Inc., Princeton, N.J.

[21] Appl. No.: 09/085,646

[22] Filed: May 27, 1998

[51] Int. Cl.$^7$ ........................................................ G06F 9/44
[52] U.S. Cl. ................................ 395/500.48; 395/500.05; 395/183.17; 714/738
[58] Field of Search .................... 395/500.44, 500.48, 395/500.18, 183.07, 183.17, 500.05, 500.49; 371/27.1, 27.4, 22.1, 22.2

[56] References Cited

U.S. PATENT DOCUMENTS

| | | | |
|---|---|---|---|
| 5,377,201 | 12/1994 | Chakradhar et al. | 371/23 |
| 5,602,856 | 2/1997 | Teramoto | 371/27 |
| 5,831,996 | 11/1998 | Abramovici et al. | 371/27.1 |

OTHER PUBLICATIONS

T. Larrabee, "Efficient Generation of Test Patterns Using Boolean Satisfiability," Stanford University, Feb. 1990.

M. Gokhale, et al., "Building and Using a Highly Parallel Programmable Logic Array," Computer, Jan. 1991, pp. 81–89.

T. Larrabee, "Test Pattern Generation Using Boolean Satisfiabiilty, "IEEE Transactions on Computer–Aided Design, vol. 11, No. 1, Jan. 1992, pp. 4–15.

S. Chakradhar, et al., "A Transitive Closure Algorithm for Test Generation," IEEE Transactions on Computer–Aided Design of Integrated Circuits and Systems, vol. 12, No. 7, Jul. 1993, pp. 1015–1028.

P. Athanas, "Processor Reconfiguration Through Instruction–Set Metamorphosis," Computer, Mar. 1993, pp. 11–18.

R. Razdan, et al., "PRISC Software Acceleration Techniques," 1994 IEEE, pp. 145–149.

P. Athanas, et al., "Real–Time Image Processing on a Custom Computing Platform," Computer, Feb. 1995, pp. 16–24.

J. Silva, et al., "GRASP—A New Search Algorithm for Satisfiability," 1996 IEEE, pp. 220–227.

T. Suyama, "Solving Satisfiability Problems on FPGAs".

*Primary Examiner*—Kevin J. Teska
*Assistant Examiner*—Thai Phan
*Attorney, Agent, or Firm*—Sughrue, Mion, Zinn, Macpeak & Seas, PLLC

[57] ABSTRACT

A Boolean SAT solver uses reconfigurable hardware to solve a specific input problem. Each of the plurality of ordered variables has a corresponding one of a plurality of state machines. Each state machine has an implication circuit for its respective variable, and operates in parallel according to an identical state machine. One state machine implements the Davis-Putnam method in hardware and provides improved performance over software by virtue of the parallel checking of direct and transitive implications. Another state machine implements a novel non-chronological backtracking method that takes advantage of the parallel implication checking and avoids the need to maintain or to traverse a GRASP type implication graph in the event of backtracking. The novel non-chronological backtracking provides for setting a blocking variable as a leaf variable and for changing only the value of the leaf variable, but possibly changing both the value and identity of a backtracking variable.

12 Claims, 9 Drawing Sheets

Fig. 1

```
Initialize, all variables assigned to "free" value
do      {
        Compute implications and check contradiction;
        if (contradiction)
                        if (active_variable→assigned_value = = 1)
                                active_variable→assigned_value = 0;
                        else
                                backtrack( );
                        endif
        else
                        active_variable = next_free_variable( );
                        active_variable→assigned_value = 1;
                endif
} while ( )
```

IMPLEMENTATION OF BOOLEAN SATISFIABILITY WITH NON-CHRONOLOGICAL BACKTRACKING IN RECONFIGURABLE HARDWARE

BACKGROUND OF THE INVENTION

1. Field of the Invention

This invention relates to accelerating automatic test pattern generation (ATPG) and logic synthesis/verification by accelerating the Boolean Satisfiability (SAT) problem. In particular, the invention provides for a configurable computing approach for SAT-solving that can offer substantial speedups (>200× in many cases) over traditional software approaches. Since Boolean satisfiability approaches are logical-operation-intensive, the hardware approach can show large advantages by mapping portions of the SAT expressions directly to logic gates, and by harnessing large amounts of parallelism in the evaluation of the logic.

2. Related Work

An FPGA (field programmable gate array) is a known integrated circuit whose functionality can be programmed and changed in software itself. Inasmuch as FPGA's are well known and commercially available (for example, the VIRTUALOGIC SLI EMULATOR from IKOS Systems, Inc.), the details thereof will be omitted for clarity. FPGA's are useful in configurable hardware systems. That is, FPGA's can provide a hardware machine whose functionality can change in response to programming by software.

Configurable hardware systems have been used in different ways. Prior uses of configurable computing have often been directed to applications that are computationally intensive and have uniform data. Prior configurable computing applications therefore generally been characterized in that the programmable logic of the FPGA's typically consists of a large number of parallel data paths and very little control. In other words, configurable computing applications have used only simple control flow.

Boolean SAT is a problem which requires more than simple control flow, and a first configurable hardware system for implementing Boolean SAT was proposed by the same inventors in U.S. patent application Ser. No. 08/919,282, filed on Aug. 28, 1997, incorporated herein by reference in its entirety. This first SAT-solving configurable hardware system featured a SAT solver based generally on the Davis-Putnam algorithm. The basic Davis-Putnam algorithm provides for backtracking that is chronological. That is, the algorithm backtracks to the most recently assigned variable.

The inventors are aware of two other proposals for solving SAT using reconfigurable hardware:

- T. Suyama, M. Yokoo, and H. Sawada. Solving Satisfiability Problems on FPGA's. In 6th Int'l Workshop on Field-Programmable Logic and Applications, September 1996.
- M. Abramovici and D. Saab. Satisfiability on Reconfigurable Hardware. In Seventh International Workshop on Field Programmable Logic and Applications, September 1997.

Suyama et al. (Suyama, hereafter) propose their own SAT algorithm which is not the Davis-Putnam approach. In the Suyama algorithm, each variable in the SAT formula always has some assigned value. The Suyama algorithm proceeds by transitioning from one completely defined set of values to another completely defined set of values. The authors of Suyama propose heuristics to prune the search space, but admit that the number of states visited in their approach can be eight times larger than the basic Davis-Putnam approach. In addition, the Suyama approach requires a max calculator and a complex rule checker, making it very hardware resource intensive.

The above-identified proposal of Abramovici et al. (Abramovici, hereafter) also is not an implementation of the Davis-Putnam SAT algorithm. The Abramovici proposal basically is an implementation of a PODEM-based algorithm in reconfigurable hardware. A PODEM-based algorithm assumes that a satisfying assignment for the entire CNF formula can be found by assigning values to a predefined subset of variables in the formula. For more information on this type of algorithm, see the following document which is hereby incorporated by reference for its useful background information:

P. Goel. An Implicit Enumeration Algorithm to Generate Tests for Combinational Logic Circuits. *IEEE Transactions on Computers*, C30(3):215–222, March 1981.

This has direct application in the SAT problem generated in the ATPG domain since the circuit under test has well-defined primary inputs and outputs, and since the test vector must be applied at the primary inputs with the result being observed at a primary output. The Abramovici proposal therefore cannot handle a generic CNF formula directly.

Another disadvantage of PODEM (and, thus, Abramovici) is that, even though the number of variables in the SAT decision tree is reduced, there is not necessarily a reduction in the number of states visited during the search. The capturing of relationships between internal variables in Davis-Putnam's efficient data structures has been shown to reduce the state space visited and to reduce the run time significantly over PODEM.

Another disadvantage of the Abramovici proposal is the hardware requirements. These requirements include (i) separate circuits for forward and backward implication, each one a few times larger than the original circuit, (ii) a complex control circuit with 2n inputs, 2n outputs, and 3 n-bit registers, where n is the number of primary inputs, (iii) a very large stack n wide and n deep, (iv) and two copies of the entire original circuit, in order to generate a test for a fault. Although the authors of the Abramovici proposal indicate that the size of the stack potentially can be reduced, such a reduction comes with the expense of significantly increased encoding and decoding circuitry. Thus, the Abramovici proposal is disadvantageous in that the hardware requirements are very great. If a large circuit is tested, this strains the current chip integration or logic emulation limits. Thus, the hardware cost of keeping two circuit copies, in addition to stacks and other control structures, is great.

Most software for SAT solving today is based on the Davis-Putnam algorithm. Recent software implementations of the Davis-Putnam algorithm have enhanced it in various ways while maintaining the same basic flow. To learn more about the enhancements, see the following, each of which is incorporated by reference for its useful background information:

T. Larrabee. Test Pattern Generation Using Boolean Satisfiability. In *IEEE Transactions on Computer-Aided Design*, volume 11, pages 4–15, January 1992.

S. Chakradhar, V. Agrawal, and S. Rothweiler. A transitive closure algorithm for test generation. *IEEE Transactions on Computer-Aided Design of Integrated Circuits and Systems*, 12(7):1015–1028, July 1993.

P. Stephan, R. Brayton, and A. Sangiovanni-Vincentelli. Combinational Test Generation Using Satisfiability. Department of Electrical Engineering and Computer Sciences, University of California at Berkeley, 1992. UCB/ERL Memo M92/112.

J. Silva and K. Sakallah. GRASP-A New Search Algorithm for Satisfiability. In *IEEE ACM International Conference on CAD-96*, pages 220–227, November 1996.

The contribution of the GRASP work is notable since it applies non-chronological backtracking and dynamic clause addition to prune the search space further. The above-identified documents relating to the enhancements to the Davis-Putnam algorithm are directed to software implementations. There is a need for the implementation of such enhancements in reconfigurable hardware, but no prior efforts have successfully achieved the complex flow control required. The control flow associated with non-chronological backtracking is very complex. To the best of the inventors' knowledge, neither the Suyama nor the Abramovici proposal has actually been implemented on a hardware platform at all, and only simulation results have thus far been presented.

SUMMARY OF THE INVENTION

The invention is a class of input-specific configurable hardware applications that aggressively harness the increasing integration levels and reconfigurability of FPGA's by performing template driven hardware designs for each problem or data set being solved.

One exemplary embodiment of the invention is a novel SAT solver. The SAT solving application of configurable computing was selected because it highlights the differences between prior applications of configurable computing and the approach according to the invention. In particular, SAT solving is a search intensive application, whereas prior uses of configurable computing have been directed to applications that are computationally intensive and have uniform data. Prior configurable computing applications have focused on the latter with the programmable logic typically consisting of a large number of parallel data paths and very little control. Thus, the exemplary SAT solver, as an embodiment, shows a method of using configurable computing for algorithms with complex control flow. It will be appreciated that the embodiment is merely exemplary of the broader invention of implementing complex control flow in reconfigurable hardware.

Prior attempts to use configurable computing in applications have provided implementations with fairly simple data-centric systolic designs. This invention provides for implementation of complex control structures. Whereas the search algorithms implemented so far by configurable computing have been generally simple signal processing pipelines, the invention discloses how a tree search algorithm may be implemented with a hardware version of non-chronological backtracking similar to that seen in software SAT solvers. This requires complex control structures to manage the backtracking steps.

Another reason the SAT solver is useful for teaching the invention is that any search strategy is likely to use a significant amount of bit level logic operations. This aspect directly exploits the bit level logic parallelism offered by programmable logic and thus provides computational acceleration.

The term, "input-specific" configurable hardware application means the use of configurable hardware (e.g., FPGA's) to accelerate computations based on a specific problem. That is, starting from a general solution template design, the invention provides for the specialization of the accelerator design to the particular SAT formula being solved. Thus, the hardware is configured to solve the particular problems that must be solved (i.e., the "input"). Since the hardware configuration is tailored to the input, or problem, greater benefits accrue than the situation in which the hardware is configured more generally.

Other embodiments of the invention include the novel non-chronological method as applied to search problems in general; as applied to SAT problems in particular; as embodied in a computer system having configurable hardware; as embodied in a computer system without configurable hardware; and as embodied in software instructions on a computer-usable medium.

BRIEF DESCRIPTION OF THE DRAWINGS

FIG. 1 shows pseudo-code for a basic search algorithm.

FIG. 7(a) shows the algorithm in the hardware algorithm of the invention, and FIG. 7(b) shows a software algorithm used in GRASP.

DETAILED DESCRIPTION OF THE PREFERRED EMBODIMENTS

The SAT Problem

Figure 2A:
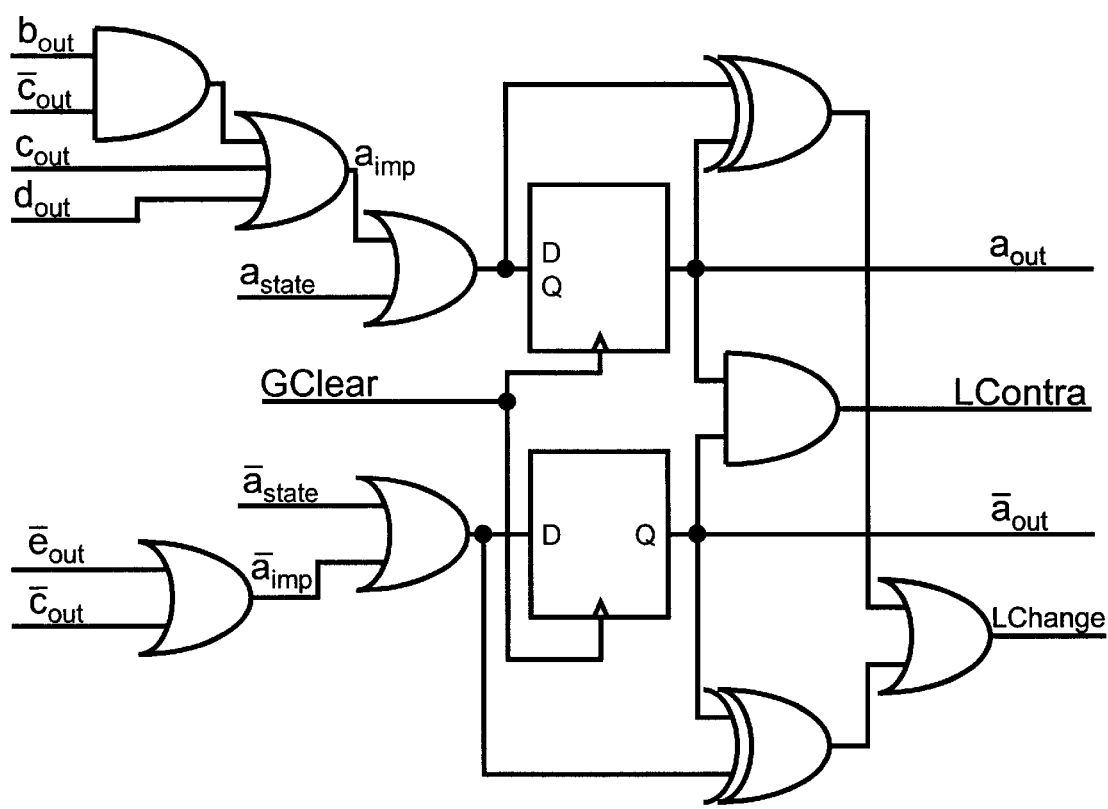
FIG. 2(a) and 2(b) show circuit for implication and conflict detection.

The Boolean satisfiability (SAT) problem is a well-known constraint satisfaction problem with many applications in computer-aided design of integrated circuits, such as test generation, logic verification and timing analysis. Given a Boolean formula, the objective is either: (a) to find an assignment of 0–1 values to the variables so that the formula evaluates to true, or (b) to establish that such an assignment does not exist.

The Boolean formula is typically expressed in conjunctive normal form (CNF), also called product of sums form. Every Boolean formula can be expressed in CNF. In this form, sum term (clause) in the CNF is a sum of single literals, where a literal is a variable or its negation. An n-clause is a clause with n literals. For example, $(v_i + \bar{v}_j + v_k)$ is a 3-clause. In order for the entire formula to evaluate to 1 each clause must be satisfied i.e., evaluate to 1.

An assignment of 0–1 values to a subset of variables (called a partial assignment) might satisfy some clauses and leave the others undetermined. For example, an assignment of $v_i = 1$ would satisfy $(v_i + \bar{v}_j + v_k)$, while $v_i = 0$ leaves the clause undetermined. If an undetermined clause has only one unassigned literal in it, that literal must evaluate to 1 in order to satisfy the clause. In such a case, the corresponding variable is said to be implied to that value. For example, the partial assignment $v_i = 0$, $v_k = 0$ implies $v_j = 0$. A variable that is not implied is considered free. A conflict or contradiction arises if the value implied to a variable is different from the value previously implied or assigned to that variable. Detection of a conflict implies that the corresponding partial assignment cannot be a part of any valid solution.

Most current SAT solvers are based on the Davis-Putnam algorithm as illustrated in FIG. 1. The following is incorporated by reference for its useful background on this topic: M. Davis and H. Putnam, A Computing Procedure for Quantification Theory, *Journal of the ACM,* 7: 201–215, 1960. The basic algorithm begins from an empty partial assignment. It proceeds by assigning a 0 or 1 value to one free variable at a time. After each assignment, the algorithm determines the direct and transitive implications of that assignment on other variables. If no contradiction is detected during the implication procedure, the algorithm picks the next free variable, and repeats the procedure. Otherwise, the algorithm attempts a new partial assignment by complementing the most recently assigned variable for which only one value has been tried so far. This step is called backtracking. The algorithm terminates when no free variables are available and no contradictions have been encountered (implying that all the clauses have been satisfied and a solution has been found), or when all possible assignments have been exhausted. The algorithm is complete in that it will find a solution if it exists.

Determining implications is crucial to pruning the search space since (1) it allows the algorithm to skip entire regions of the search space corresponding to contradictory partial assignments, and (2) every implied variable corresponds to one less free variable on which search must be performed. Unfortunately, detecting implications in software is very slow since each clause containing the newly assigned or implied variable is scanned and updated sequentially, with the process repeated until no new implications are detected.

The implication procedure central to the algorithm is both parallelizable and mappable to basic logic gates. The inventors' entire hardware architecture is designed to take advantage of this parallelism. Below is detailed the inventors' mapping of the Davis-Putnam algorithm onto reconfigurable hardware in a formula-specific manner.

Formula-Specific Mapping: Davis-Putnam Algorithm

Hardware Organization

Analogous to software, the inventors' hardware implementation of the Davis-Putnam algorithm has two parts: (i) the implication circuit, and (ii) a state machine to manage the backtracking-based exploration of the search space. Given a SAT formula, both hardware modules are generated automatically.

The speedup over software arises from the inventors' implementation of the implication circuit. Unlike software, this circuit finds all direct implications of a newly assigned or all newly implied variables in a single clock cycle. Consequently, all transitive implications of a new variable assignment can be determined in a small fraction of the clock cycles required by software.

In the invention, each variable has an implication circuit.

The Implication Circuit

Figure 2B:
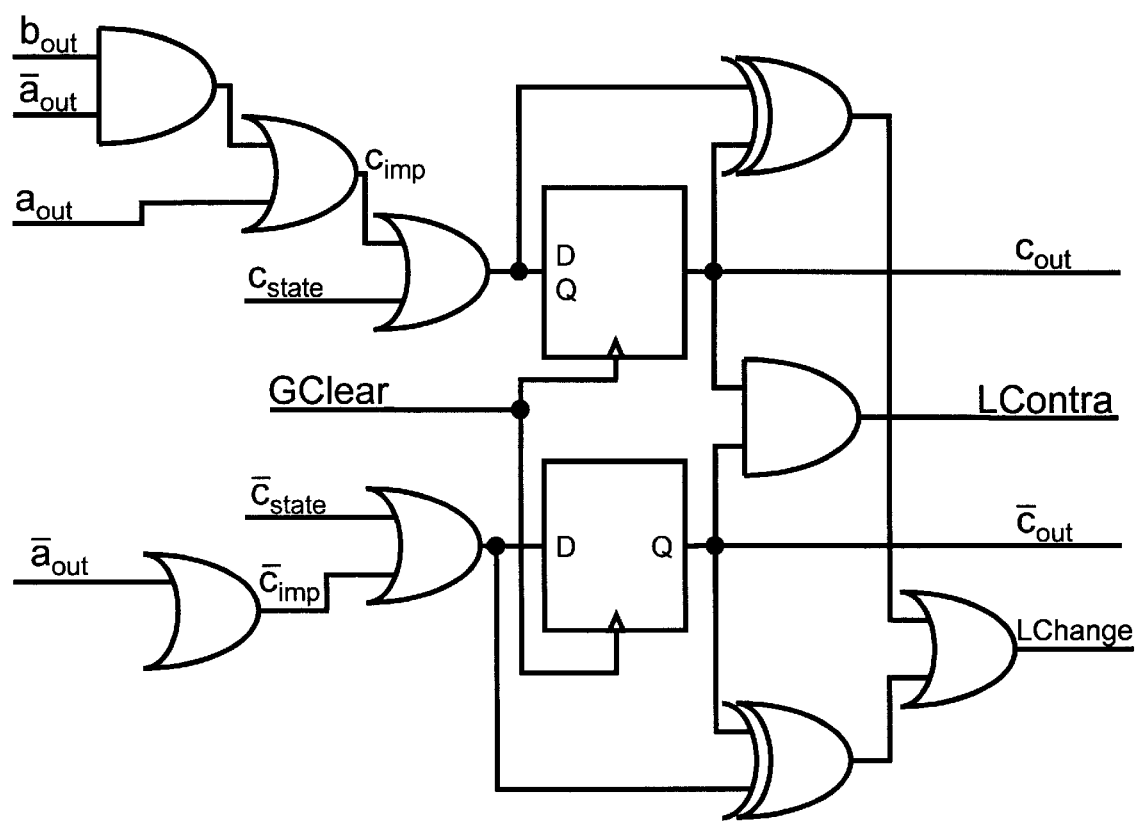

FIG. 2a and FIG. 2b show the details of an exemplary implication circuit. The state of each variable in the circuit is encoded by the values taken by its literals. Given a variable v, if its literal pair $(v, \bar{v})$ has the value (0,0), the variable v has no value assigned to it either by implication or by assignment and is free. If it has the value (1,0) or (0,1), the variable v is understood to have the value 1 or 0, respectively. Finally, if $(v, \bar{v})$ takes the value (1,1), there is a contradiction since the variable v cannot take the values 1 and 0 simultaneously.

The role of the implication circuit is to determine the implied value of each literal. A literal evaluates to 1 either if it is implied to 1 or assigned to 1. In the circuit, the value of each literal is, therefore, the Boolean OR of its implied and assigned values. A contradiction arises when both literals of any variable become 1. The contradiction signal is generated as the Boolean OR of the AND of each pair of literals.

In order to determine the implied value of a literal, the circuit must encapsulate the relationships between variables arising from the clauses in the CNF formula. The circuit will normally be different for each variable.

An exemplary implication circuit for literal a will now be described with reference to FIG. 2a. Given the clauses $(\bar{c}+a)(\bar{d}+a)(\bar{b}+c+a)(e+\bar{a})(c+\bar{a})$, it can be concluded that if c=1, or if d=1, or if b=1 and c=0, a must take on the value 1, i.e., a is implied to 1. Similarly, if e=0 or c=0, a is implied to 0. In this example, the equation for the implied value of literal a would be $a_{imp}=c+d+b\bar{c}$ as shown in FIG. 2a. c, d, b and $\bar{c}$ are the literals for the corresponding variables. Similarly, the equation for the literal $\bar{a}$ would be $\bar{a}_{imp}=\bar{e}+\bar{c}$.

An exemplary implication circuit for literal c will now be described with reference to FIG. 2b. Given the same five clauses $(\bar{c}+a)(\bar{d}+a)(\bar{b}+c+a)(e+\bar{a})(c+\bar{a})$, it can be concluded from the first clause that, if a takes the value of 0, then $\bar{c}$ is implied to 1. The second clause. The second clause does not implicate C. In the third clause, it can be concluded that, if a =0 and $\bar{b}$=0, then c is implied to 1. The fourth clause does not implicate c. It can be concluded from the fifth clause that, if $\bar{a}$=0, then c is implied to 1. The equation for the implied value of literal c would be $c_{imp}=\bar{a}\bar{b}+a$, which equation is reflected in the logic gates of FIG. 2b. The equation for the literal $\bar{c}$ would be $\bar{c}_{imp}=\bar{a}$. FIG. 2b shows $\bar{a}$ as the sole input to an OR gate for illustration.

Thus, the implication circuit varies for each literal depending on the CNF clauses in the problem to be solved.

Even the small example above has a loop in the implication dependencies since the values of literals $\bar{a}$ and $\bar{c}$ are dependent on each other. In theory, the entire circuit for computing the values of all literals in the formula can be implemented without any flip-flops in spite of the presence of such loops. Because the loops are all non-inverting, the combinational circuit is guaranteed to converge to the correct values, but there can be extremely long combinational paths and resultant long cycle times.

To avoid these problems, a circuit is used in which each literal is latched by a clocked D flip-flop before being fed back. During each clock cycle, the circuit determines in parallel the direct implications of all the variables that were assigned or implied in the previous cycle. The procedure completes when no new implications are detected during a clock cycle. New implications are detected by taking the XOR of the input and output of the D flip-flop for each literal. If any of these XOR gates has a 1 output (i.e., LChange is 1), the circuit must go through one more clock cycle. The number of clock cycles from the beginning of the implication procedure with the most recent variable assignment until the generation of the completion signal is potentially much smaller than in software since a potentially large number of new implications are generated in each clock cycle, and all the subsequent direct implications arising from these newly implied variables are determined in parallel immediately in the next clock cycle. This parallelism is quite considerable in practice: for the aim-100-6_0-yes1-1 example in the DIMACS suite, this approach yields an average of 41.9 parallel clause evaluations per cycle. In that example, as many as 395 clauses are effectively processed in a single cycle. These numbers are typical of other benchmarks.

Global Circuit Topology and the Backtrack State Machine

Two important features of the circuit organization according to the invention are that (i) a separate state machine is implemented for each variable, (ii) the order in which variables are assigned is determined a priori. Consequently, the global circuit topology according to the invention takes the form shown in FIG. 3. Each box in the figure contains the literal computation circuit and the state machine for each variable. This distributed topology keeps global signals to a minimum and reduces hardware costs. At any instant, only one state machine is in control. Once that state machine has finished processing, it asserts Eor (i.e., Enable Outgoing to Right signal) to transfer control to the state machine on the right (if progressing forward in the computation) or it asserts $E_{ol}$ (i.e., Enable Outgoing to Left signal) to pass control to the left (if backtracking). Each state machine is aware of whether its variable has been assigned, implied or is free.

Figure 4:
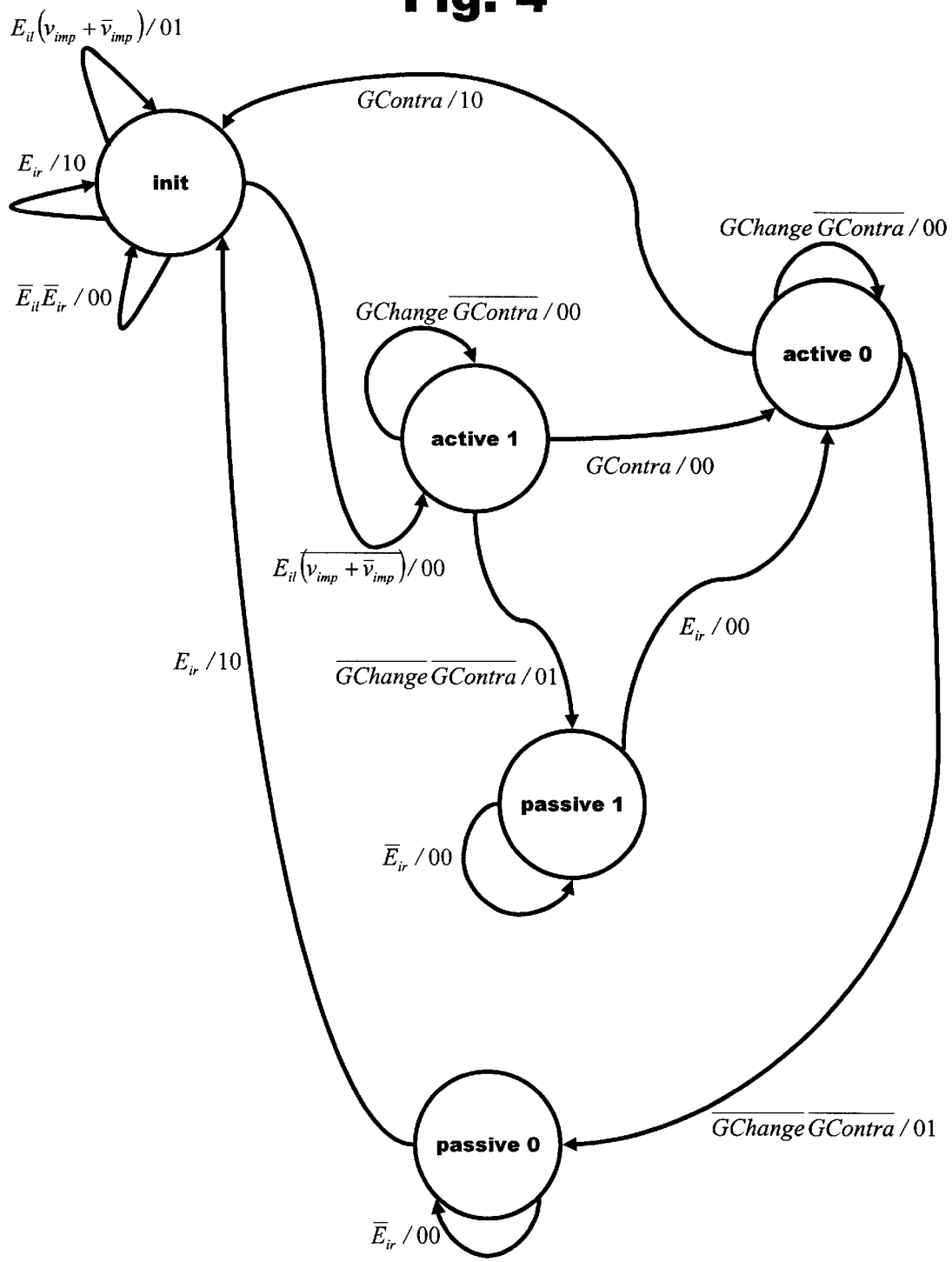
FIG. 4 shows a state diagram for a machine with chronological backtracking.

The state machine for a single variable is shown in FIG. 4. The five states in the state machine are encoded by three bits. Each state machine is substantially identical. Two bits correspond to the values of the positive and negative literals of its variable. The third bit indicates whether this particular state machine is active.

The inputs to each state machine include $E_{il}$ (i.e., Enable Incoming from Left signal), $E_{ir}$ (Enable Incoming from Right signal), GContra (the global contradiction signal), GChange (the global change signal), and GClear (the global signal to reset all flip flops). Each state machine is clocked in the normal fashion by a common clock signal.

Figure 3:
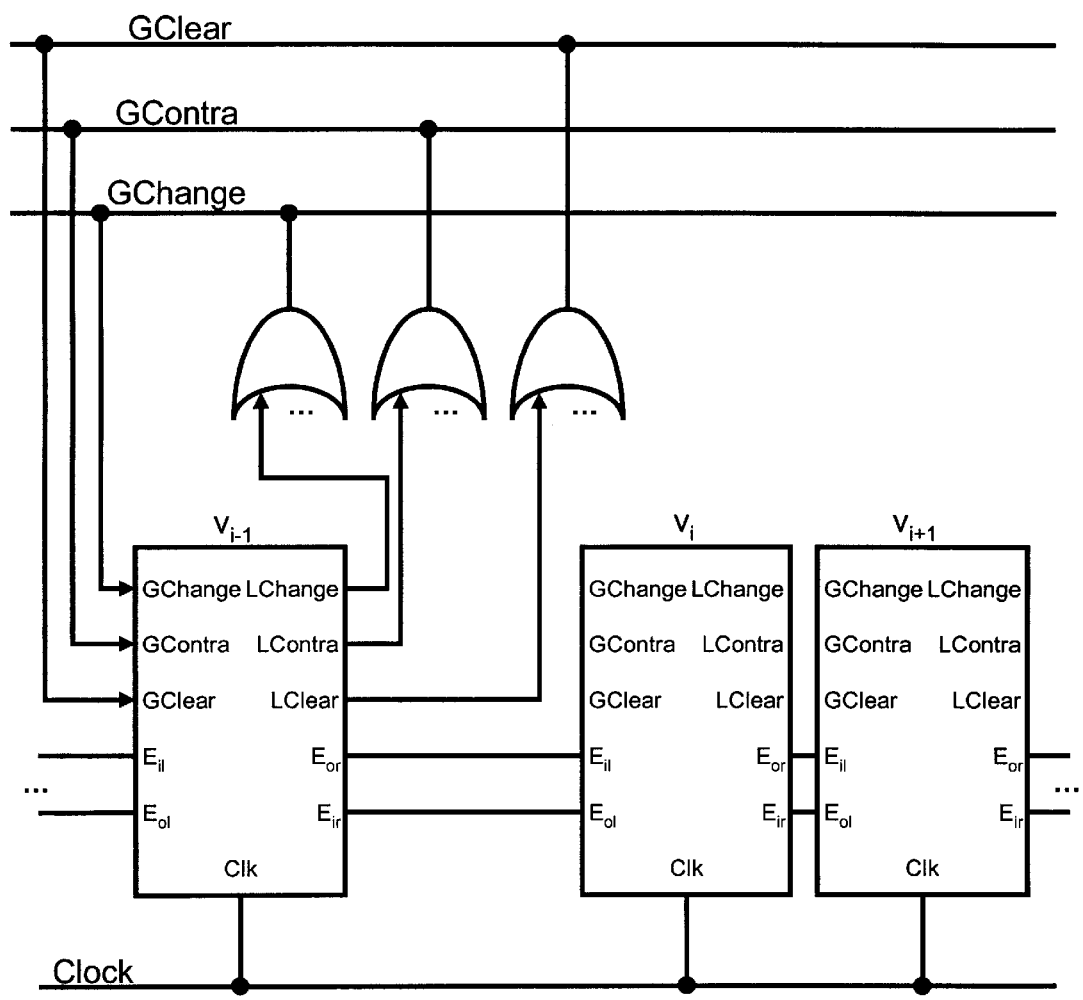
FIG. 3 shows a global circuit topology.

The outputs from each state machine include $E_{ol}$ and $E_{or}$ (already mentioned), LContra (the local contradiction signal), LChange (the local change signal), LClear (the local clear signal). In FIG. 3, the inputs and outputs for each state machine are shown. Machine $v_{i-1}$ is left of machine $v_i$, which is left of machine $V_{i+1}$. Although not shown, for the sake of clarity, all of the LChange outputs are OR'd together to produce GChange; all of the LContra outputs are OR'd together to produce GContra; and all of the LClear outputs are OR'd together to produce GClear. Also not shown, for the sake of clarity, is that the GChange input is common to every machine, as is the GContra input and the GClear input.

Also not shown in the figures is that there is an implication signal. Recall that each machine keeps track of whether its variable is free, assigned, or implied. When a value of 1 is the result for either $v_{imp}$ or $\overline{v}_{imp}$, then the variable is implied. A local implication signal may thus be understood to be obtainable from $v_{imp}+\overline{v}_{imp}$ within a particular state machine. The local implication signal is useful in that it allows the state machine quickly to skip through states where a variable's value already is implied.

In FIG. 4, the following convention is used. Next to each state transition line appears a legend. Each legend has a format of input/output. That is, the items preceding the slash (/) are the inputs required to cause the state machine to transition from its present state to the state indicated by the state transition line. The items following the slash are the outputs that are provided as a result of the state transition. In particular, these outputs are $E_{ol}$ and $E_{or}$.

For example, there is a state transition line from the init state to the active 1 state. The legend appearing next to this state transition line is $$E_{il}(\overline{v_{imp} + \overline{v}_{imp}})/00.$$

This legend means that, if the state machine is in the init state, then if $E_{il}$ becomes 1 and there are no values implied for the variable v, then the state of the state machine transitions to the active 1 state and the state machine outputs 0 for $E_{ol}$ and 0 for $E_{or}$ (thereby keeping the present state machine as the active state machine).

Forward Computation: After initialization, all the state machines are in the init state. When a state machine receives an enable signal, the current literal values and the enable's direction are used to determine whether to assert a new value, and which new value to assert. If control is transferred from the left (i.e., $E_{il}$=1) and the variable's value is currently free (i.e., it is in the init state and no value is implied; $(v,\overline{v})$ has the value (0,0)), then it asserts the value 1 (transitioning to active 1) and determines all the transitive implications of that assignment. That is, $(v,\overline{v})$ is set to (1,0). Referring to FIG. 2a, e.g., setting $(a,\overline{a})$ to (1,0) would be accomplished by setting $a_{state}$ =1 and $\overline{a}_{state}$=0. While implications are still settling (i.e., as long as GChange is asserted) and there is no contradiction (i.e., as long as GContra is 0), the process waits by transitioning repeatedly to the same state. Once implications have settled, there may be contradictions. If so, (i.e., GContra is asserted) it will try the value 0 instead (active 0) and repeat the implication step. If not, it transfers control to the state machine on its right and it transitions to the passive 1 state. From active 0, if a contradiction is detected, it will backtrack. Its state is reset to init and the control is passed to the left. On the other hand, if implications settle without a contradiction, then it moves from active 0 to passive 0 and passes the control to the right.

If, as above, control is transferred to a state machine from the left, but its variable's value already has been implied by a previous assignment (i.e., either $v_{imp}$=1 or $\overline{v}_{imp}$=1), then it merely passes control to the state machine on its right on the next clock cycle and remains in the init state.

Backtracking: If control is transferred to a state machine from the right, then computation is backtracking due to a contradiction, and the goal is to try to find a new assignment that avoids the contradiction. In this scenario, there are three possible responses, again depending on the current local variable values.

First, if the state machine is in the init state (which may be the case if the variable has been implied by some previous assignment during earlier forward computation), then the state machine stays in the init state and passes control to the state machine on its left.

Second, if the variable currently has the assigned value 1 (i.e., it is in the passive 1 state), then it instead assigns the value 0 to it (moving to active 0), and determines the implications of that assignment. If no contradiction is found, then the conflict has been cleared, and computation can once again progress by having this state machine transfer control to its right. If, however, a contradiction is again found, then it is reset to init and transfers control left.

The third possible scenario is that this variable already has the assigned value 0 (i.e., it is in the passive 0 state). This indicates that the process has already tried both possible values for this variable; in this case, it transitions to the init state thereby unassigning its value, and backtracks by transferring control to the left.

Finding a Solution: At any point in the above descriptions, a solution has been found when the rightmost state machine further attempts to pass control to the right. On the other hand, if the leftmost state machine attempts to backtrack by further passing control to the left, then this indicates that no solution to the problem exists.

Formula-Specific Mapping: Non-Chronological Backtrack Algorithm

When the Davis-Putnam algorithm backtracks to the most recently assigned variable, its backtracking is said to be chronological. On the other hand, when an algorithm jumps over several previously-assigned variables to a variable more than one level above the current variable, the backtracking is said to be non-chronological. In order to jump directly to a previous level, the algorithm must first determine that no combination of values on the skipped variables will result in a satisfying assignment. By intelligently jumping over these variables, the algorithm avoids wasting the time it takes to explicitly assign these variables to their various combination of values only to determine that all these combinations lead to a contradiction. GRASP is a recent implementation of non-chronological backtracking in a SAT solver. The GRASP work demonstrated that non-chronological backtracking can lead to significant reductions in run time.

GRASP maintains a data structure called an implication graph from which one can derive the chain of implications leading to the contradiction. GRASP uses this data structure to identify the level that it can jump to.

It is very difficult to implement, in reconfigurable hardware, such an implication graph. This would involve adding more hardware to traverse the implication circuits to identify the source of conflicts or contradictions. It will be recalled that the invention involves the rapid development of a custom hardware circuit to solve a specific problem. For this approach to save overall time in comparison to the use of only software, the custom hardware circuit must not take too long to arrange and must not be too extravagant with respect to hardware resources.

The approach according to the invention takes advantage of the fact that, due to the parallelism, determining implications is very fast in the above-identified hardware implementation of the SAT-solver. In particular, when a contradiction occurs for both assignments of a particular variable, the goal is to revert back to the variable closest to the current variable such that, by flipping the value on this earlier variable, the contradiction can be made to go away. This approach saves time because the process reverts back to this earlier variable without having tried an exponential number of combinations of values on the variables that were jumped over.

Assume that $v_i$ is the variable for which a contradiction was detected for both assignments to $v_i$, with i being its level. The procedure according to the invention works its way up the levels, one level at a time. At each level j (<i), the procedure calls the implication routine twice, once for each value for $v_j$ while $v_j$ has a flipped value. The variables $v_k$ between i and j (j<k <i) are left unassigned when the implication routine is called, i.e. both literals $v_k$ and $\bar{v}_k$ are set to 0. The algorithm must backtrack to $v_j$ if a no-contradiction case was found for one of the two assignments. If both assignments of $v_j$ cause a contradiction, the variable $v_j$ can be skipped, and the procedure repeats this step for variable $v_{j-1}$.

Further below, this operation is explained using a more detailed example in which $v_i$ is used, and in which $v_k$ is discussed as being $v_{i-1}$, and $v_j$ is discussed as being $v_{i-2}$.

This procedure requires only 2n calls to the implication routine if the algorithm reverts back by n levels. Since the procedure does not call the implication routine an exponential number of times, and since the implication routine in hardware is very fast, this analysis for non-chronological backtracking can be expected to be very fast also. In comparison, GRASP has the overhead of maintaining the implication graph data structure and analyzing it when a contradiction is found, but it does not do the 2n implications.

Figure 6:
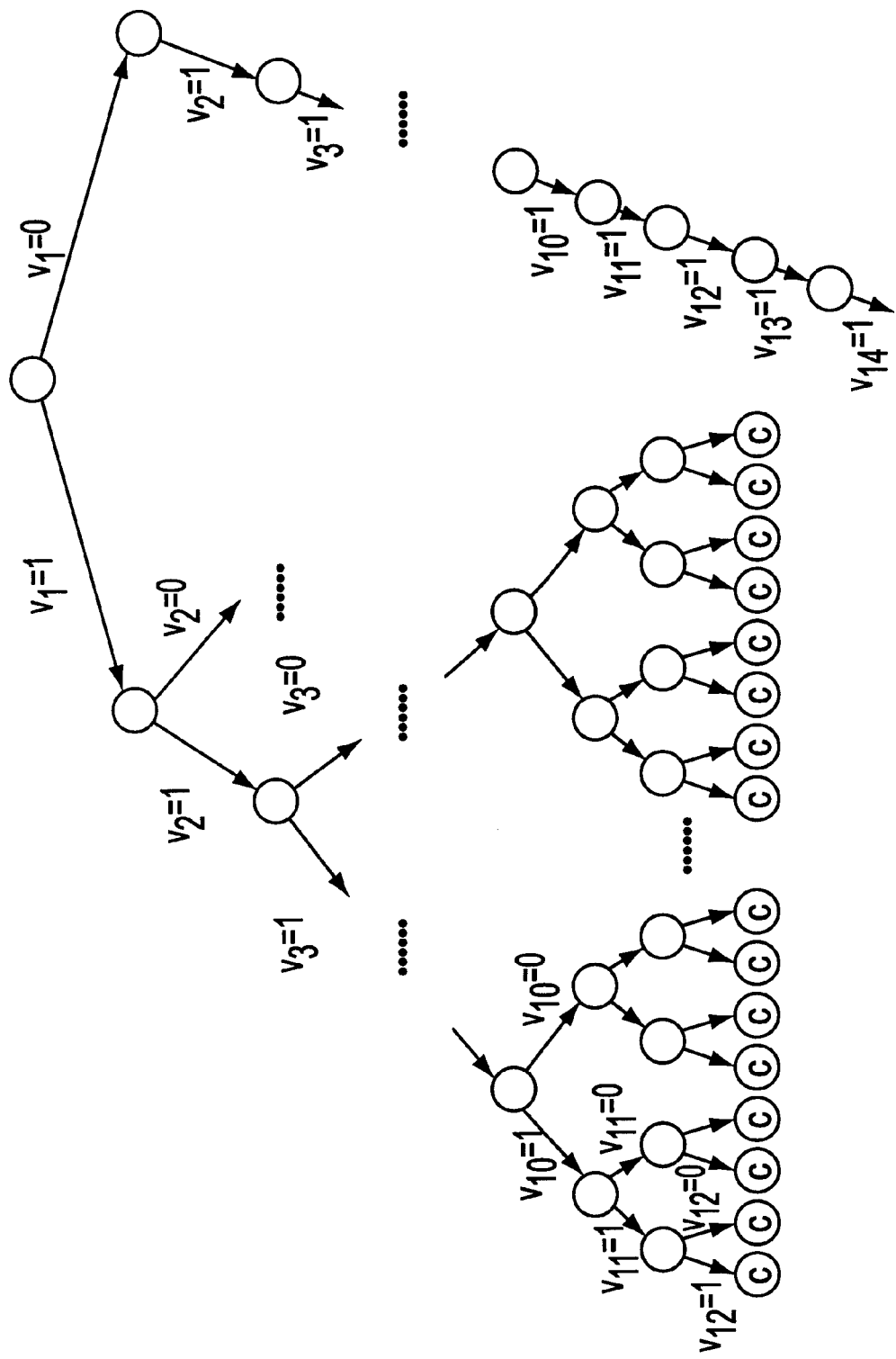
FIG. 6 shows a search example for basic backtracking.

The following simple example, to be understood in relation to FIG. 6, shows how the procedure according to the invention works. Suppose there is the following formula: ($\overline{v_1}+\overline{v_{12}}+v_{13}$)($\overline{v_1}+\overline{v_{12}}+\overline{v_{13}}$)($\overline{v_1}+v_{12}+\overline{v_{14}}$) ... Assume that any assignment for variables $v_2$–$v_{11}$ does not lead to a contradiction. The basic search tree for this formula is shown in FIG. 6. In the figure, each solid arrow represents assigning a new value and determining its implications. It begins by assigning $v_1=1$ and goes on until $v_{11}=1$. Finally, $v_{12}=1$ is tried. This leads to a contradiction, since $v_{13}$ is simultaneously required to be both 0 and 1 (by virtue of the first two clauses of the formula above).

Similarly, $v_{12}=0$ also leads to a contradiction (by virtue of also the third and fourth clauses above). The normal backtrack procedure would reset $v_{12}$ to unknown and it would backtrack to $v_{11}$. The conflict disappears temporarily but will appear again whenever $v_{12}$ is set.

Figure 7A:
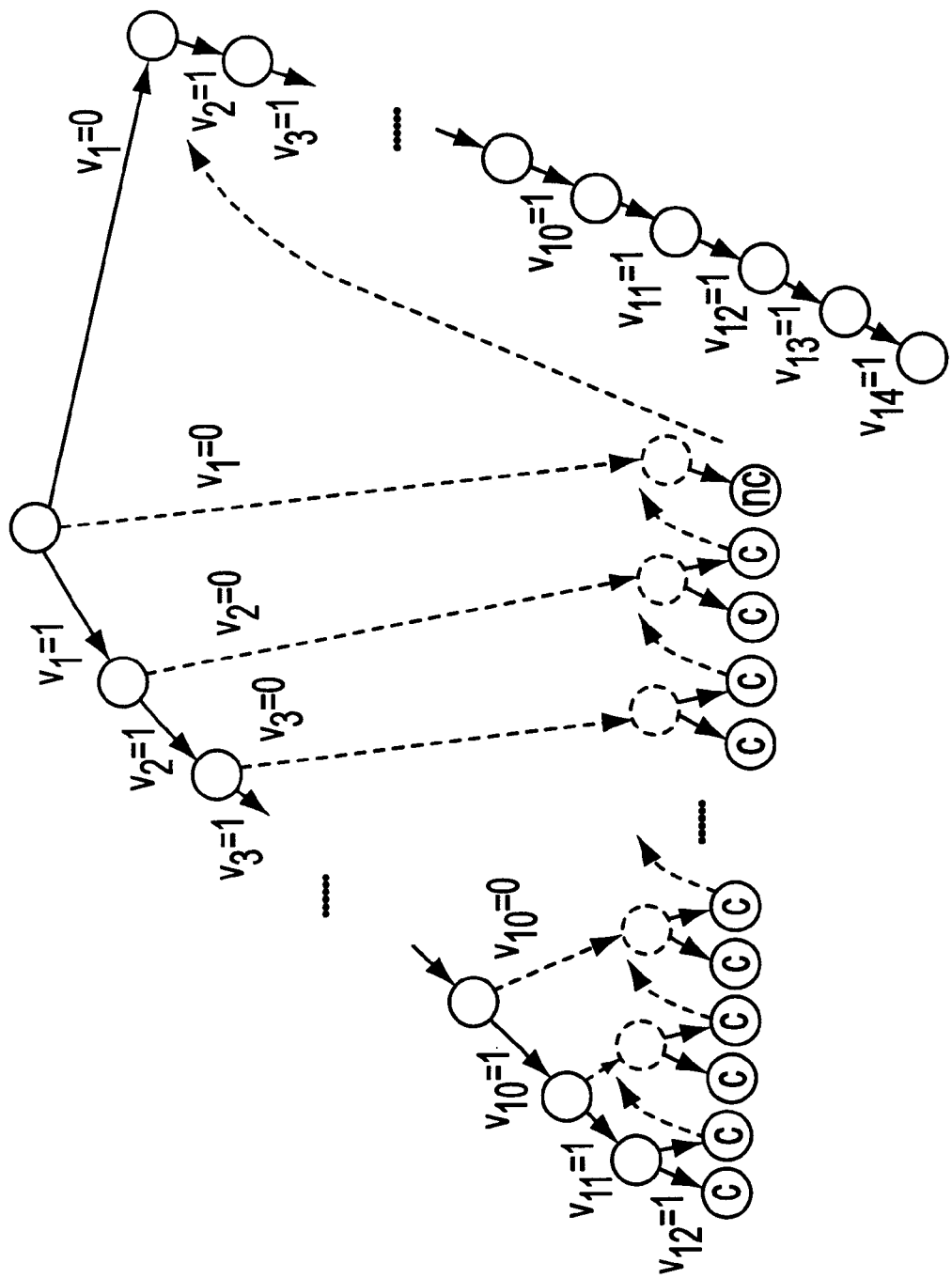
FIGS. 7(a) and 7(b) show two search examples for non-chronological backtracking. In particular.
Figure 7B:
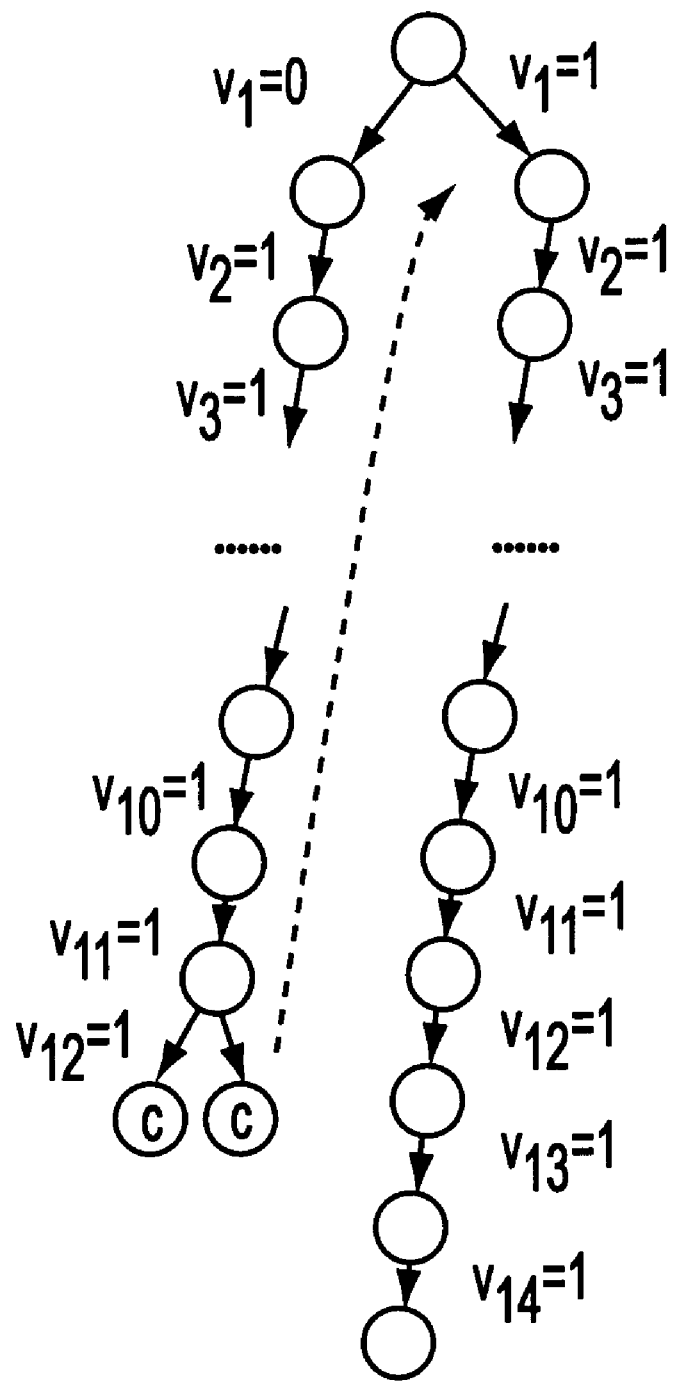

FIG. 7(a) shows the version of non-chronological backtracking according to the invention. The dotted arrows indicate skipping and do not incur any computation; they simply show what values are assumed before an implication calculation. The search is the same before reaching $v_{12}$. Backtracking differs, however. When backtracking at each level, the implication procedure is called twice. That is, backtracking to $v_1$ occurs after effectively calling the implication procedure only 22 times, rather than 4082 attempts with the standard backtracking approach. While this simple example is mainly pedagogic, dramatic speedup potential also exists in real benchmarks. For example, in the aim-100-1_6-yes1-1 benchmark from the SAT suite, chronological backtracking visits 606578 partial assignments while non-chronological backtracking algorithm only visits 1384 partial assignments.

The novel backtracking approach for the reconfigurable hardware SAT-solver will now be explained in another way. It may be said that the SAT-solver includes a plurality of state machines, each corresponding to only one of a plurality of variables in a Boolean SAT problem. The plurality of variables are ordered based on a predetermined heuristic, thereby providing also an arrangement of the state machines, with the first state machine corresponding to the first variable, and with the last state machine corresponding to the last variable.

Since the variables are Boolean, the search space may be thought of as a binary tree with the first variable at the top, or highest level. The variable may be thought of as a node. The two values which the variable may assume define the branches leading from the node downward to a next lower level. The level below the highest level contains a node for each of the branches, and all of the nodes at this level relate to the variable after the first variable (i.e., the second variable). The binary tree continues until the lowest level, at which all of the possible nodes relate to the last ordered variable.

By convention, the two branches leading from all the nodes are themselves ordered (i.e., the branch corresponding to the value 1 is leftmost, and the branch corresponding to the value 0 is rightmost). For linguistic convenience, the two binary values may be described as being a first value and a second value. In the examples, the first value will be 1 and the second value will be 0, although this is certainly arbitrary and only for the sake of explanation. Also, the first value is, by default, the value first assigned to a variable when testing for logical agreement or Contradiction. Thus, in the examples, free variables are normally first given the first value (of 1) for testing, and then, if necessary, subsequently given the second value (of 0).

During processing, each variable has a state or condition that is either assigned, implied, or free. To avoid confusion with the states of the state machine described infra, the term condition will usually be used to refer to whether a variable is assigned, implied, or free. Thus, a variable may be said to be in a free condition, an implied condition, or an assigned condition. When the reconfigurable hardware SAT-solver is searching for a solution, it is normal that some variables will be in an assigned condition, some will be in an implied condition, and others will be in a free condition. An overall logical consistency among the assigned and the implied variables exists when there is no contradiction among them (since free variables have no logical value, they do not impact the overall logical consistency. The assigned and the implied variables, at a given point in time, may hereafter collectively be referred to as the logically valued netlist.

At a given level of processing, level i, all of the nodes relate to variable $v_i$. The level above level i in the direction of the highest level may be understood as level i−1, and all of the nodes at level i−1 relate to variable $v_{i-1}$. The level above level i−1 will be understood to be level i−2 and contains nodes relating to variable $v_{i-2}$. Similar terminology applies for levels below level i.

When both possible binary values for $v_i$ result in a logical contradiction based on the assigned and the implied values of the others of the plurality of ordered variables (i.e., based on the logically valued netlist), it is clear that further progression toward the lowest level would never provide a SAT solution. To avoid wasting time progressing through nodes which could not possibly provide a solution, backtracking is performed. More particularly, non-chronological backtracking is performed to save maximum time. For convenience, a variable $v_i$ for which both possible binary values result in a logical contradiction for the present logically valued netlist, may be hereafter referred to as a blocking variable.

Non-chronological backtracking, in detail, may be performed as follows. The blocking variable is set as a leaf variable. The leaf variable, as will be seen below, is characterized in that it is switched between the first value and the second value until the contradiction is cleared.

The variable $v_{i-1}$ is then considered. Variable $v_{i-1}$ is presently referred to as an upper level variable under consideration or, for convenience, the backtracking variable. There are two possibilities relating to the backtracking variable. One possibility is that the backtracking variable has the first value. Another possibility is that the backtracking variable has the second value. Each of these two possibilities will be discussed in turn.

The first possibility is now discussed. If the backtracking variable already has the first value assigned, then the backtracking variable is flipped. In other words, the backtracking variable is assigned the second value instead of the first value. After the backtracking variable is assigned the second value, it is determined whether there is an assignment of the leaf variable which results in no present contradiction. That is, the logically valued netlist is tested for logical consistency with the backtracking variable having the second value, and with the leaf variable having the first value. If a contradiction is detected, then the leaf variable is flipped to the second value. Then, the logically valued netlist again is tested for logical consistency with the backtracking variable having the second value, but with the leaf variable having the second value. When variable $v_{i-1}$ which has been flipped to the second value provides a contradiction for either possible value of the leaf variable $v_i$, then the next higher level variable (i.e., variable $v_{i-2}$) is designated as the backtracking variable and, at the same time, variable $v_{i-1}$ is put in a free condition.

The second possibility is now discussed. If the backtracking variable already has the second value assigned, then the first value must have resulted in some previous contradiction. When the backtracking variable already has the second value assigned, therefore, the backtracking variable is not flipped. Instead, the next higher level variable (i.e., variable $v_{i-2}$) is designated as the backtracking variable and, at the same time, variable $v_{i-1}$ is put in a free condition.

When the next higher level variable is designated as the backtracking variable in either of the two possibilities mentioned above, the same analysis ensues. In other words, there are two possibilities relating to the new backtracking variable. One possibility is that the backtracking variable has the first value. Another possibility is that the backtracking variable has the second value.

As will now be understood from the foregoing explanation, the non-chronological backtracking process involves detecting a blocking variable and setting it as the leaf variable, and then varying the values of the leaf variable without ever selecting another variable as the leaf variable. To put it another way, the process involves varying the value of the leaf variable but not the identity of the leaf variable.

The non-chronological backtracking process also involves varying the values of the backtracking variable, and also involves selecting higher and higher level variables to be the backtracking variable until the contradiction is cleared. To put it another way, the process according to the invention involves varying the value and the identity of the backtracking variable.

Backtracking ceases when logical consistency is attained in the present logically valued netlist. After backtracking ceases, the normal forward computation mentioned above is undertaken to identify a solution to the SAT problem. In switching over from backtracking to forward computation, the leaf variable is put in a free condition. Forward computation proceeds downward from the present the backtracking variable.

Hardware Organization

To implement the above novel non-chronological backtracking algorithm, the state machine must be modified from the embodiment with chronological backtracking. An especially advantageous aspect of the presently preferred embodiment, no new global signals are added and the implication circuit is also not modified.

Figure 5:
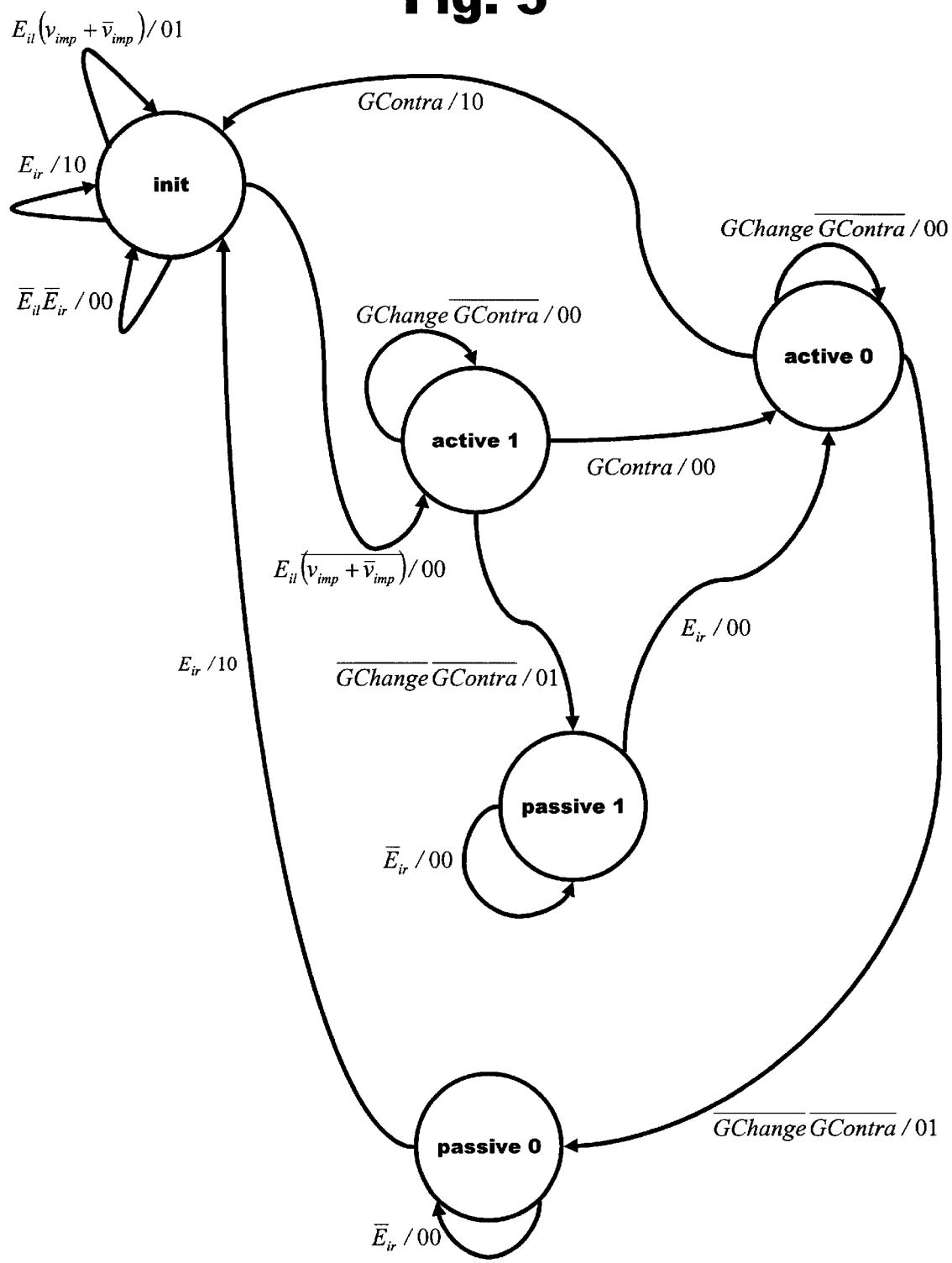
FIG. 5 shows a state diagram for a machine with non-chronological backtracking.

The state machine to perform the non-chronological backtracking is shown in FIG. 5. It has more states and transitions to reflect the complex backtracking procedure outlined previously. Although the state machine has become bigger, the extra states require only one more encoding bit.

Although the meaning of the state machine shown in FIG. 5 is substantially self-explanatory to those knowledgeable in this field, a brief explanation of it will now be provided.

Each variable begins in the init state. In the init state, the variable $v_i$ may be in a free condition or in an implied condition. In the init state, if the variable is not implied (i.e., if $(v_{imp}+\overline{v}_{imp})$), then an $E_{il}$ signal causes a transition from init to active 1. When in active 1, the variable $v_i$ is given the first value which, in this embodiment, is 1. Assuming no contradiction, GChange will be high until all implications settle and the state will not normally transition. When GChange goes low, the implications are settled. No contradiction means GContra is low. When GChange and GContra are both low, the conditions are met to transition to passive 1. Transitioning to passive 1 also causes an output of 0 for $E_{ol}$ and 1 for $E_{or}$. The output of 1 for $E_{or}$ activates the machine to the right, which corresponds to the next lower level variable $v_{i+1}$.

When in active 1, recall that the variable $v_i$ is given the first value. If this value results in a contradiction with the logically valued netlist, then the GContra signal is received. As soon as the GContra signal is received, whether or not the implications have settled, the conditions are met to transition to active 0. Transition to active 0 causes an output of 0 for $E_{ol}$ and 0 for $E_{or}$. In other words, transition to active 0 results in the presently active state machine remaining active.

When in active 0, the variable is given the second value which, in this embodiment, is 0. When the variable is given the second value, the implications are determined throughout the logically valued netlist by each implication circuit. Assuming the implications settle with no contradiction, GChange will go low and GContra will be low. These signals satisfy the conditions to transition to passive 0. Transitioning to passive 0 from active 0 causes an output of 0 for $E_{ol}$ and an output of 1 for $E_{or}$. The output of 1 for $E_{or}$ activates the machine to the right, which corresponds to the next lower level variable $v_{i+1}$.

The foregoing operations with respect to states init, active 1, passive 1, active 0, and passive 0 are substantially the same as in the above-identified embodiment that uses chronological backtracking. The manner in which the embodiment according to the invention with non-chronological backtracking is different will now be described.

Assume that there are three adjacent state machines in a larger set of adjacent state machines. Of these three machines, the lowest corresponds to variable $v_i$; the next higher level machine corresponds to $v_{i-1}$, and the next progressively higher level machine corresponds to variable $v_{i-2}$. For convenience, these three machines may be referred to as the $v_{i-2}$ machine, the $v_{i-1}$ machine, and the $v_i$ machine.

Assume that, during forward computation, $v_{i-2}$ was assigned the first value 1 with no contradictions and transitioned to the passive 1 state, and that $v_{i-1}$ and $v_i$ were then still in a free condition. As the $v_{i-2}$ machine transitioned to passive 1, it output $E_{or}=1$. This $E_{or}$ from the $v_{i-2}$ machine was received by the $v_{i-1}$ machine as $E_{il}=1$. This signal caused machine $v_{i-1}$ to transition to the active 1 state in which the first value (i.e., 1) was assigned to $v_{i-1}$. Assuming that implications settled (i.e., GChange low) with no contradiction (i.e., GContra low), the $v_{i-1}$ machine transitioned to passive 1 and, as it transitioned, it output $E_{or}=1$. For this example, it will also be assumed that the assignment of $v_{i-1}=1$ also did not change the condition of $v_i$ from free.

The $v_i$ machine received the $E_{or}$ from the $v_{i-1}$ machine as $E_{il}$ and, since $v_i$ was in a free condition, the $v_i$ machine transitioned from init to active 1. In active 1, the $v_i$ machine assigned the first value to $v_i$ (i.e., $v_i=1$). When the first value was assigned to $v_i$, the implication circuits determined whether the logically valued netlist was still logically consistent or whether $v_i=1$ provided a contradiction. For this example, it is assumed that $v_i=1$ resulted in a logical contradiction. Thus, the implication circuit detecting the contradiction output LContra=1. This signal, OR'd together with the other LContra signals as shown in FIG. 3, resulted in GContra=1. The $v_i$ machine, upon receiving a high value for GContra, transitioned from the active 1 state to the active 0 state.

In active 0, the $v_i$ machine assigned the second value to $v_i$ (i.e., $v_i=0$). Again, the implication circuits determined whether this assignment provided a contradiction. For this example, it is assumed that $v_i=0$ resulted in a logical contradiction. In other words, for $v_1$, assignment of the first value and the second value both resulted in a logical contradiction within the logically valued netlist. To put it another way, $v_i$ was then a blocking variable with respect to the present logically valued netlist. Thus, backtracking is required.

The signal GContra received by the $v_i$ machine in response to the assignment of the second value to $v_i$ caused the $v_i$ machine to transition from active 0 to the leaf 1 state. As the $v_i$ machine transitioned from the active 0 to the leaf 1 state, it output $E_{ol}=1$ and $E_{or}=0$. In the leaf 1 state, the $v_i$ machine set $v_i=1$. In other words, the blocking variable was set as the leaf variable.

The states in the state machine are implemented as hardware in the configurable hardware. The hardware that implements the foregoing states leading to the identification of a blocking variable, and setting it as a leaf variable, may be understood as a concrete example of a means for identifying a blocking variable as a leaf variable.

The $E_{ol}=1$ output by the $v_i$ machine was received by the $v_{i-1}$ machine as $E_{ir}=1$. The $v_{i-1}$ machine was in the passive 1 state. When the $v_{i-1}$ machine received $E_{ir}=1$, this caused the $v_{i-1}$ machine to transition to the bk 0 a state. The $v_{i-1}$ machine transitioned to the bk 0 a state at substantially the same time the $v_i$ machine transitioned to the leaf 1 state. In the bk 0 a state, the $v_{i-1}$ machine flipped $v_{i-1}$ from 1 to 0. In other words, in bk 0 a, the $v_{i-1}$ machine assigned $v_{i-1}=0$.

Thus, $v_{i-2}=1$ as mentioned above, and the $v_{i-2}$ machine is in passive 1 ; $v_{i-1}=0$ and the $v_{i-1}$ machine is in bk 0 a; and $v_i=1$ and its machine is in leaf 1 . What has happened is that, when $v_i$ provided a contradiction for both possible values and thus was a blocking variable with respect to the present logically valued netlist, $v_i$ was set as the leaf variable. Also, the variable at the next higher level (i.e., $v_{i-1}$ ) became the backtracking variable. There were two possibilities relating to the backtracking variable. It might have had the first value Is assigned, or the second. Since the backtracking variable had the first value, the backtracking variable was flipped to the second value. Also, the leaf variable $v_i$ was assigned the first value.

When $v_{i-1}$ was assigned the second value ($v_{i-1}=0$) in bk 0 a and $v_i$ was assigned the first value, the implication circuits checked for logical consistency in the logically valued netlist. For the sake of this example, it will be assumed that a contradiction was detected and that GContra went high.

As soon as GContra went high, the $v_{i-1}$ machine and the $v_i$ machine transitioned. In particular, the $v_{i-1}$ machine transitioned to state bk 0 b and the $v_i$ machine transitioned to state leaf 0. In bk 0 b, the $v_{i-1}$ machine kept backtracking variable $v_{i-1}$ at the second value. In the leaf 0 state, the $v_i$ machine flipped leaf-variable $v_i$ to the second value (i.e., $v_i=1$). The implication circuits checked for logical consistency in the logically valued netlist with the backtracking variable $v_{i-1}$ at the second value (i.e., 0) and the leaf variable at the second value (i.e., 0).

For the sake of this example, it will be assumed that a contradiction was detected, causing GContra to go high. As soon as GContra went high, all three machines were affected.

In particular, the $v_i$ machine transitioned from leaf 0 back to leaf 1 thus resulting in $v_i=1$. That is, the leaf variable kept the same identity, but changed value upon the detection of the contradiction..

The $v_{i-1}$ machine transitioned from bk 0 b to init. As it transitioned, it output $E_{ol}=1$ and $E_{or}=0$. In init, the variable $v_{i-1}$ was set to the free condition.

The $E_{ol}=1$ output by the $v_{i-1}$ machine was received by the $v_{i-2}$ machine as $E_{ir}=1$. This input to the $v_{i-2}$ machine caused a transition from passive 1 to bk 0 a. In other words, the variable $v_{i-2}$ became the backtracking variable. In bk 0 a, the value of $v_{i-2}$ was set to the second value (i.e., 0).

Thus, the $v_{i-2}$ machine was then in state bk 0 a with $v_{i-2}=0$; the $v_{i-1}$ machine was then in the init state with $v_{i-1}$ in a free condition; and the $v_i$ machine was then in the leaf 1 state with $v_i=1$. It will be noted that, when $v_{i-1}$ was the backtracking variable and was assigned the second value, and when contradictions were detected for both values of the leaf variable $v_i$, that the condition of the backtracking variable was set to free, and that the identity of the backtracking variable was set to the next higher level variable $v_{i-2}$.

At this point, the implication circuits checked for contradictions in the logically valued netlist with $v_{i-2}=0$; $v_{i-1}$ free; and $v_i=1$. For the sake of this example, it will be assumed that a contradiction was not detected. Thus, once all of the implications settled (i.e., GChange went low), the signal GContra stayed low.

With GChange and GContra both low, the three machines were affected as follows. The $v_{i-2}$ machine transitioned from bk 0 a to passive 0. As it transitioned, it output $E_{ol}=0$ and $E_{or}=1$. It is clear from FIG. 5 that, if control returns to the $v_{i-2}$ machine, then the $v_{i-2}$ machine will transition to the init state and p ass control to the next higher level. This is in harmony with the above-identified non-chronological backtracking approach. When $v_{i-2}$ becomes the backtracking variable, and it already has the second value (i.e., $v_{i-2}$ already is set to 0), then there is no more checking to be done at the $v_{i-2}$ level and checking must proceed at a higher level. In the present example, however, the $v_{i-2}$ machine remains at passive 0.

When GChange and GContra both went low, the $v_{i-1}$ machine also was affected. In particular, the $v_{i-1}$ machine had been in the init state with the variable $v_{i-1}$ in the free condition (i.e., no implied value). Assuming that no value for $v_{i-1}$ had been implied by the most recent checking for contradictions by the implication circuits, then the $v_{i-1}$ machine would transition to active 1.

When GChange and GContra both went low, the $v_i$ machine also was affected. In particular, the $v_i$ machine transitioned from the leaf 1 state with $v_i=1$ to the init state. In the init state the variable $v_i$ was set to the free condition.

The hardware implementing the leaf 1 and leaf 0 states may be thought of as a concrete example of a means for varying the value of the leaf variable. The hardware implementing the bk 0 a and bk 0 b states in the next state machine over from the state machine that tracks the leaf variable may be similarly understood as a means for setting and varying a first backtracking variable at a level higher than a level of the leaf variable. Likewise, the harware implementing the bk 0 a and bk 0 b states in the next state machine over from the state machine with the first backtracking variable may be understood as a means for setting and varying a second backtracking variable when the first backtracking variable produces a logical contradiction.

As the foregoing example illustrates, this embodiment of the invention provides for non-chronological backtracking using reconfigurable hardware.

Depending on the problem characteristics, the configurable computing implementation can often offer significant speedups over a software SAT solver, and the hardware solver with non-chronological backtracking can offer additional speedups over the hardware solver with chronological backtracking.

In order for the acceleration to be useful, however, it must offer performance advantages even after hardware compile time and configuration time is considered. For this reason, it is recommended that the configurable hardware techniques mainly be used on SAT problems with very long GRASP runtimes (hours or days) or in cases where GRASP aborts. In such cases, the hardware synthesis times required will be acceptable.

Overall, there is envisioned a system where easy SAT problems are still solved in software; very large problems, ones that often timeout today, will invoke the hardware compiler and configure an FPGA board to assist in solving them.

The envisioned hardware platform is a high-performance workstation with an FPGA board attached via an external connection or the I/O bus. Easy to solve problems are handled by software running on the workstation itself, while longer-running problems are handled by the FPGA board. Requirements for the FPGA board itself are partly a function of the hardware size of the problems being solved; this is discussed in the following subsection.

Hardware requirements for the inventive approach are a function of the size and complexity of the formula being solved. The template-based design for SAT-solving according to the invention requires no memory, nor are any input data downloaded before or during problem solution. Instead, the full problem is embedded into the FPGA's configurable logic blocks (CLBS).

The SAT solver's CLB requirements naturally vary widely with the formula to be solved. Across the DIMACS benchmarks, the median CLB requirements are 3655. Overall, relatively few (less than 30%) of these problems will fit within the 1000 or 2000 CLB limits of current FPGA chips (for more particulars concerning FPGA chips, see the following useful background document which is incorporated herein by reference: The Programmable Logic Data Book, Xilinx Corp. San Jose, Calif., 1994). Most however, will fit on less than ten FPGA's.

Partitioning the design across FPGA's is straightforward because of the regular topology used. In the experiments, the inventors have used the partitioning and pin multiplexing techniques in the IKOS SLI logic emulation system originally developed as part of the MIT Virtual Wires effort. For more information about the MIT Virtual Wires effort, please see the following document which is incorporated by reference for its background information:

J. Babb, R. Tessier, and A. Agarwal. Virtual Wires: Overcoming pin limitations in FPGA-based logic emulators. In *Proceeding & IEEE Workshop on FPGA-based Custom Computing Machines,* pages 142–151, April 1993.

This partitioning software can multiplex several inter-chip signals to use the same physical pins, thereby circumventing the pin limitations that can often limit the CLB utilization of FPGA designs. Furthermore, the software performs this multiplexing with minimal impact on hardware cycle times.

Overall, the invention provides several important contributions. First, there is provided a system design for. formula-specific Boolean satisfiability solutions based on a configurable hardware implementation. The novel design's hardware requirements are quite modest. Moreover, the performance results of the hardware according to the invention indicate that the configurable hardware approach has the potential for dramatic improvements over even the best current software-based techniques.

Also, the invention provides a novel approach to non-chronological backtracking that may be implemented in configurable hardware. However, the non-chronological backtracking according to the invention may also be implemented in other ways. For example, it may be implemented in a computer system without configurable hardware. That is, a computer system embodying the invention will contains hardware and software enabling it to perform the non-chronological backtracking approach.

Similarly, the above-identified invention may be embodied in a computer program product, as will now be explained.

On a practical level, the software that enables the computer system to perform the above-identified approach and operations of the invention, is supplied on any one of a variety of media. The software can relate, in particular, to a system having configurable hardware or one without configurable hardware. In the former case, the software will include configuration instructions.

Furthermore, the actual implementation of the approach and operations of the invention may actually be statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media", or "computer-readable media", as used here, may include a diskette, a tape, a compact disc, an integrated circuit, a cartridge, a remote transmission via a communications circuit, or any other similar medium useable by computers. For example, to supply software for enabling a computer system to operate in accordance with the invention, the supplier might provide a diskette or might transmit the software in some form via satellite transmission, via a direct telephone link, or via the Internet.

Although the enabling software might be "written on" a diskette, "stored in" an integrated circuit, or "carried over" a communications circuit, it will be appreciated that, for the purposes of this application, the computer usable medium will be referred to as "bearing" the software. Thus, the term "bearing" is intended to encompass the above and all equivalent ways in which software is associated with a computer usable medium.

For the sake of simplicity, therefore, the term "program product" is thus used' to refer to a computer useable medium, as defined above, which bears in any form of software to enable a computer system to operate according to the above-identified invention. Thus, the invention is also embodied in a program product bearing software which enables a computer to perform the above-described non-chronological backtracking method according to the invention.

We claim:

1. A configurable apparatus for solving inputted search problems, comprising:

a memory having configuration instructions;

a hardware system configurable according to said configuration instructions;

said configuration instructions configuring said hardware system to perform a search based on a current one of said inputted search problems; and said configuration instructions configuring said hardware system so that, for each of said inputted search problems, backtracking performed during said search includes non-chronological backtracking under control of said hardware system.

2. The configurable apparatus as set forth in claim 1, wherein said inputted search problems are reduced to Boolean Satisfiability (SAT) problems, and wherein said configuration instructions configure said hardware system so that, for said Boolean SAT problems, said search is a Boolean SAT solution search with said non-chronological backtracking.

3. The configurable apparatus as set forth in claim 2, wherein said configuration instructions configure said hardware system to define:

means for identifying a blocking variable as a leaf variable;

means for varying the value of the leaf variable;

means for setting and varying a first backtracking variable at a level higher than a level of the leaf variable; and means for setting and varying a second backtracking variable at a level higher than the level of the first backtracking variable and unassigning the value of the first backtracking variable, when the first backtracking variable produces a logical contradiction.

4. A method for non-chronological backtracking of a netlist of variables comprising:

identifying a blocking variable as a leaf variable;

varying the value of the leaf variable;

setting, as a first backtracking variable, a variable with a level higher than the level of the leaf variable, and varying the value of the first backtracking variable;

evaluating the netlist for logical consistency based on the value of the leaf variable and the value of the first backtracking variable;

when the evaluation produces a logical contradiction, varying a backtracking variable identity by setting, as a second backtracking variable, a different one of the variables with a level higher than the level of the first backtracking variable, varying the value of the different backtracking variable, and unassigning the value of the first backtracking variable; and then evaluating the netlist for logical consistency based on the value of the leaf variable and the value of the second backtracking variable.

5. A non-chronological backtracking method for determining a satisfying variable assignment for a conjunctive normal form (CNF) representation of a set of Boolean formula variables ordered in levels, each of the variables having a respective level, the set of variables defining a logically valued netlist, the method comprising:

identifying a blocking variable as a leaf variable, and varying the value of the leaf variable;

setting, as a first backtracking variable, one of the variables with a level higher than the level of the leaf variable, and varying the value of the first backtracking variable;

evaluating in parallel the logically valued netlist for logical consistency based on the value of the leaf variable and the value of the first backtracking variable;

in response to the evaluation producing a logical contradiction, varying a backtracking variable identity by setting, as a second backtracking variable, a different one of the variables with a level higher than the level of the first backtracking variable, varying the value of the different backtracking variable, and unassigning the value of the first backtracking variable;

evaluating in parallel the logically valued netlist for logical consistency based on the value of the leaf variable and the value of the second backtracking variable.

6. A non-chronological backtracking method for determining a satisfying variable assignment for a conjunctive normal form (CNF) representation of a set of Boolean formula variables ordered in respective levels and defining a logically valued netlist, the method comprising:

(a) varying, with respect to a leaf variable, only a leaf variable value, said leaf variable value being determined based on a blocking variable;

(b) varying, with respect to a backtracking variable, a backtracking variable identity and a backtracking variable value, said backtracking variable having a higher said level than that said leaf variable; and (c) evaluating, in parallel, said logically valued netlist for logical consistency based on said leaf variable value, said backtracking variable value, and said backtracking variable identity.

7. The non-chronological backtracking method as set forth in claim 6, wherein said evaluating step comprises:

providing an ordered plurality of state machines, each corresponding to one of said Boolean formula variables and ordered identically therewith;

for each of said plurality of state machines, providing an implication circuit;

combining the output of each implication circuit to provide a global contradiction signal indicating said logically valued netlist is not logically consistent.

8. The non-chronological backtracking method as set forth in claim 7, wherein said combining step further comprises providing a global change signal indicating whether all transitive implications of said logically valued netlist have been determined.

9. A computer system adapted to determine a satisfying variable assignment for a conjunctive normal form (CNF) representation of a set of Boolean formula variables ordered in respective levels and defining a logically valued netlist, comprising:

a processor, and a memory including software instructions adapted to enable the computer system to perform the steps of:

(a) varying, with respect to a leaf variable, only a leaf variable value, said leaf value being determined based on a blocking variable;

(b) varying, with respect to a backtracking variable, a backtracking variable identity and a backtracking variable value, said backtracking variable having a higher said level than that of said leaf variable; and (c) evaluating, in parallel, said logically valued netlist for logical consistency based on said leaf variable value, said backtracking variable value, and said backtracking variable identity.

10. A computer program product for enabling a computer to determine a satisfying variable assignment for a conjunctive normal form (CNF) representation of a set of Boolean formula variables ordered in respective levels and defining a logically valued netlist, comprising:

software instructions for enabling the computer to perform predetermined operations, and a computer readable medium bearing the software instructions;

the predetermined operations including the steps of:

(a) varying, with respect to a leaf variable, only a leaf variable value, said leaf value being determined based on a blocking variable;

(b) varying, with respect to a backtracking variable, a backtracking variable identity and a backtracking variable value, said backtracking variable having a higher said level than that of said leaf variable; and (c) evaluating, in parallel, said logically valued netlist for logical consistency based on said leaf variable value, said backtracking variable value, and said backtracking variable identity.

11. A non-chronological backtracking method for determining a satisfying variable assignment for a conjunctive normal form (CNF) representation of a set of Boolean formula variables ordered in respective levels and defining a logically valued netlist, the method comprising:

providing an ordered plurality of state machines, each corresponding to one of said Boolean formula variables;

for each of said plurality of state machines, providing an implication circuit;

combining the output of each implication circuit to provide a global contradiction signal indicating when said logically valued netlist is not logically consistent;

providing a global change signal indicating whether all transitive implications of said logically valued netlist have been determined by said implication circuits; and permitting only one of said plurality of state machines to be in control;

wherein said ordered plurality of state machines are provided so that each of said state machines includes: an initialization state, an active first state, a passive first state, an active second state, a passive second state, two backtrack states, and two leaf states.

12. The non-chronological backtracking method as set forth in claim 11, wherein said each state machine performs the steps of:

when in said initialization state, remaining in said initialization state and passing control to a lower level state machine when receiving control from a higher level state machine with said corresponding Boolean variable being in an implied condition;

when in said initialization state, remaining in said initialization state and passing control to said higher level state machine when receiving control from said lower level state machine;

transitioning from said initialization state to said active first state when receiving control from said higher level state machine with said corresponding Boolean variable not being in said implied condition;

transitioning from said active first state to said passive first state and passing control to said lower level state machine when said global change signal indicates no more transitive implications and said global contradiction signal indicates logical consistency;

transitioning from said active first state to said active second state when said global contradiction signal indicates logical inconsistency;

transitioning from said active second state to said passive second state and passing control to said lower level state machine when said global change signal indicates no more transitive implications and said global contradiction signal indicates logical consistency;

transitioning from said passive first state to a first one of said two backtrack states when receiving control from said lower level state machine;

transitioning from said first one of said two backtrack states to a second one of said two backtrack states and changing said corresponding Boolean value when said global contradiction signal indicates logical inconsistency;

transitioning from said second one of said two backtrack states to said initialization state and passing control to said higher level state machine when said global contradiction signal indicates logical inconsistency;

transitioning from either of said two backtrack states to said passive second state and passing control to said lower level state machine when said global change signal indicates no more transitive implications and said global contradiction signal indicates logical consistency;

transitioning from said passive second state to said initialization state and passing control to said higher level state machine when receiving control from said lower level state machine;

transitioning from said active second state to a first one of said two leaf states and passing control to said higher level state machine when said global contradiction signal indicates logical inconsistency;

transitioning from one of said two leaf states to the other when said global contradiction signal indicates logical inconsistency; and transitioning from either of said two leaf states to said initialization state when said global change signal indicates no more transitive implications and said global contradiction signal indicates logical consistency.

* * * * *